(12) United States Patent
Chan et al.

(10) Patent No.: US 9,000,570 B2
(45) Date of Patent: Apr. 7, 2015

(54) SEMICONDUCTOR DEVICE WITH CORNER TIE BARS

(71) Applicants: Weng Hoong Chan, Klang (MY); Ly Hoon Khoo, Klang (MY); Boon Yew Low, Petaling Jaya (MY)

(72) Inventors: Weng Hoong Chan, Klang (MY); Ly Hoon Khoo, Klang (MY); Boon Yew Low, Petaling Jaya (MY)

(73) Assignee: Freescale Semiconductor, Inc., Austin, TX (US)

(*) Notice: Subject to any disclaimer, the term of this patent is extended or adjusted under 35 U.S.C. 154(b) by 43 days.

(21) Appl. No.: 13/939,183

(22) Filed: Jul. 11, 2013

(65) Prior Publication Data

US 2015/0014831 A1    Jan. 15, 2015

(51) Int. Cl.
*H01L 23/495* (2006.01)
*H01L 21/82* (2006.01)

(52) U.S. Cl.
CPC .......... *H01L 23/49575* (2013.01); *H01L 21/82* (2013.01); *H01L 23/49541* (2013.01)

(58) Field of Classification Search
CPC ................... H01L 23/49541; H01L 23/49575; H01L 21/82
USPC ..................................................... 257/670, 676
See application file for complete search history.

(56) References Cited

U.S. PATENT DOCUMENTS

| | | | |
|---|---|---|---|
| 6,867,071 B1 | 3/2005 | Lee et al. | |
| 7,847,392 B1 | 12/2010 | Choi | |
| 2010/0290202 A1 | 11/2010 | Sasaki | |
| 2011/0068448 A1* | 3/2011 | Camacho et al. | 257/676 |
| 2011/0140250 A1* | 6/2011 | Lee | 257/670 |

* cited by examiner

*Primary Examiner* — Mohammad Islam
*Assistant Examiner* — John P Dulka
(74) *Attorney, Agent, or Firm* — Charles Bergere

(57) ABSTRACT

A Quad Flat Pack (QFP) type semiconductor device includes four corner tie bars that, instead of being trimmed, are used for power and/or ground connections, and alternatively, to control mold flow during the encapsulation step of the assembly process.

8 Claims, 3 Drawing Sheets

US 9,000,570 B2

SEMICONDUCTOR DEVICE WITH CORNER TIE BARS

BACKGROUND OF THE INVENTION

The present invention is directed to semiconductor device assembly and, more particularly, to a lead frame with corner tie bars used in the assembly process.

Semiconductor device packaging fulfills basic functions such as providing electric connections and protecting the die against mechanical and environmental stresses. An assembled semiconductor device has exposed electrical contacts and may be mounted on a support, such as a printed circuit board (PCB), for example, where the exposed electrical contacts are connected to external electronic circuits on the support. Using surface mount technology, the exposed electrical contacts of the device can be soldered directly to corresponding electrical contact pads on the support, providing mechanical attachment as well as electrical connections.

Semiconductor devices are commonly packaged for surface mounting by encapsulating one or more semiconductor dies in a mold compound. The encapsulation process embeds the die or dies within the molding compound. Various techniques are available for connecting the exposed electrical contacts of the device internally with electrical contact pads on the embedded semiconductor die, e.g., wire bonding.

The semiconductor device commonly has an electrically and thermally conductive metal flag (also called a die pad or paddle), which assists in cooling the device when it is being used (i.e., in operation), whether or not the flag is exposed at the surface of the encapsulation, The flag also may provide an electrical ground connection to the semiconductor die. It is common to facilitate manufacturing operations by performing many of the operations on an array of the semiconductor dies mounted on an array of flags that are linked together, the links being severed during a singulation operation. The links are typically provided by a frame structure, i.e., a lead frame array, which has an array of the flags connected by tie bars to frame members that are removed by being cut off and discarded during the singulation process. The frame structure also includes sets of the exposed electrical contacts that are supported by and integral with the frame members, until the devices are encapsulated and the frame members removed during singulation to isolate the electrical contact surfaces or leads from each other. This technique is applicable to devices where the sets of electrical contacts are disposed at the periphery of the flag and the semiconductor die, on two opposite sides or around all four sides.

In one type of surface mount semiconductor device, the flag is exposed at its bottom face but in another type the flag as well as the die are embedded in the encapsulation. In one type of package, known as Quad Flat No-lead (QFN), the exposed contacts are positioned in the bottom face of the encapsulation at its edge surface. In another type of package, known as Quad Flat Package (QFP), the exposed contacts are leads that project outward from the edge surface of the encapsulation.

In a wire bond package, the back face of the semiconductor die is mounted on a flag and the contact pads of the semiconductor die on its active face are connected to the exposed electrical contacts of the package with bond wires. A concern is to reduce movement of the bond wires due to flow of the liquid or semi-liquid molding compound during encapsulation (known as wire sweep). Such movement can result in excessive proximity of adjacent bond wires, resulting in excessive or variable mutual inductance, or even short circuits between two bond wires.

Continued reduction in the size of semiconductor devices and increases in their complexity results in an increase in the number of exposed electrical contacts of the devices and a reduction in the spacing between the electrical contacts and the spacing between the bond wires. It would be desirable to have more exposed electrical contacts, yet also to reduce the effects of wire sweep.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF THE INVENTION

Figure 1:
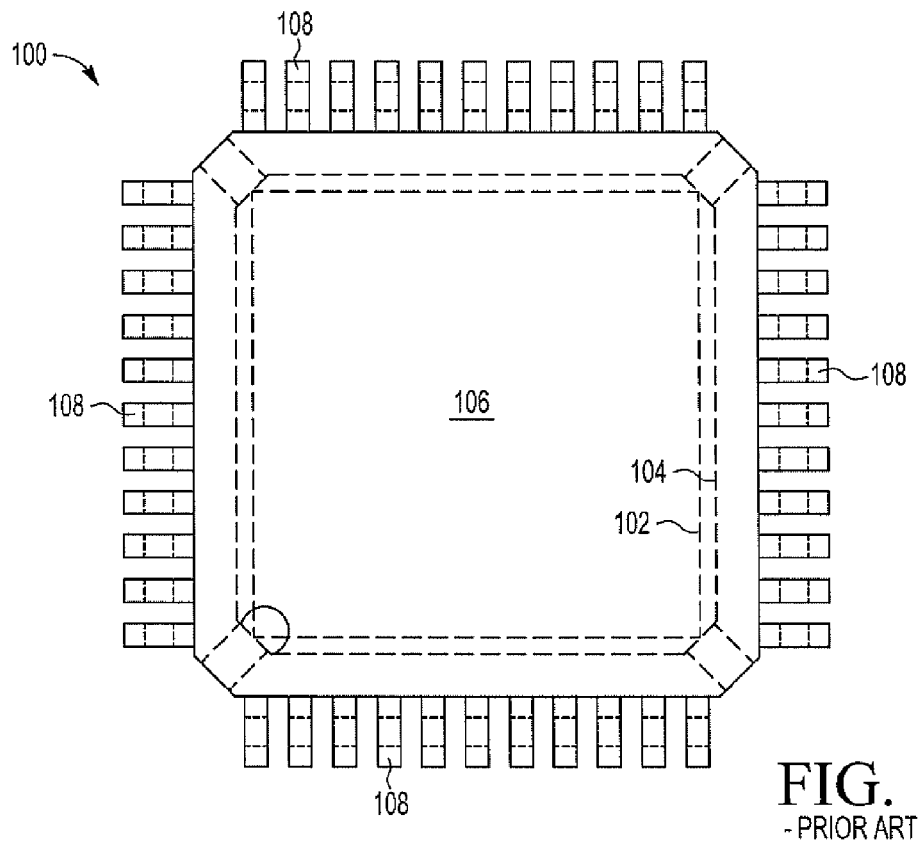
FIG. 1 is a schematic plan view of a conventional quad flat package semiconductor device.

FIG. 1 illustrates a conventional quad flat package (QFP) semiconductor device 100. The semiconductor device 100 comprises one or more semiconductor dies 102 mounted on an electrically and thermally conductive flag (or die pad or paddle) 104. The die 102 and the flag 104 are embedded in a molding compound or encapsulation 106 having top and bottom faces and an edge surface. The die 102 and flag 104 are shown in dashed lines. A set of exposed electrical leads 108 are connected with internal electrical contacts (not shown) on an active face of the die 102, the electrical leads 108 being supported by the encapsulation 106 and projecting from the edge surface for connection to an external electrical circuit.

The semiconductor device 100 is of the non-exposed pad type, in which the flag 104 is embedded in the encapsulation 106 and is not exposed in the bottom face of the encapsulation 106. Accordingly, power ground connections cannot be made directly to the flag 104 and one or more of the leads 108 are used for the power ground connection between the die 102 and the external circuit to which it will be connected. This reduces the number of the leads 108 available for signal connections. Moreover, the resistance of the power ground connection between the die 102 and the external circuit through the lead 102 and the internal connection produces an undesirable voltage drop due to the power current flowing.

FIGS. 2 to 6 illustrate a surface mount semiconductor device 200 in accordance with an embodiment of the present invention, given by way of example. The semiconductor device 200 comprises an electrically and thermally conductive flag 202 having corners and tie bars 204 extending from the corners. The semiconductor device 200 also comprises at least one semiconductor die 102 having an active face with internal electrical contacts (not shown), and a back face opposite the active face mounted on the flag 202, the die and flag again being shown in dashed lines. The die 102 and the flag 202 are embedded in an encapsulation 106 having top and bottom faces 300 and 302 and an edge surface 304 (shown in FIGS. 3 to 6). A set of exposed electrical leads 108 are connected with the internal electrical contacts. The electrical leads 108 are supported by the encapsulation 106 and project from the edge surface 304 for connection to an external electrical circuit 400 (shown in FIGS. 4 and 6). The semiconductor die 102 has a power ground connection through at least one of the tie bars 204, which is exposed as a power ground lead for the semiconductor die 102 and projects from the edge surface 204 for connection to the external electrical circuit 400.

Using the tie bars 204 as a power ground lead for the flag 202 and the semiconductor die 102 frees all the leads 108 for signal connections and the power voltage supply. The resistance of the power ground connection can be reduced, since the tie bars 204 can have a greater width than the leads 108, and since more than one of the tie bars 204 can be used as a power ground lead.

The internal electrical contacts and the electrical leads 108 may be connected by bond wires 306 bonded to the internal contacts and to the leads. In one example of an embodiment of the invention, the power ground connection includes at least one bond wire 206 connecting at least mechanically the semiconductor die 102 with the tie bar 204 which is exposed as a power ground lead. The tie bar 204 of the power connection and the bond wire 206 connected thereto extend diagonally out from the flag 202 and from the semiconductor die 102. In another example of an embodiment of the invention, the power ground connection includes at least one bond wire 208 connecting the semiconductor die 102 with the flag 104, the flag 104 connecting with at least one of the tie bars 204, which is exposed as a power ground lead. Bond wires 206 connect the tie bar 204 of the power connection at least mechanically with the semiconductor die 102, the tie bar 204 of the power connection and the bond wires 206 connected thereto extending diagonally out from the flag 104 and from the semiconductor die 102.

The edge surface 304 of the encapsulation 106 may be generally rectangular and have four corners, and the tie bar 204, which is exposed as a power ground lead may project from a corner of the edge surface 304 of the encapsulation 106. The edge surface 304 of the encapsulation 106 may be generally rectangular and have four corners with four of the tie bars 204 projecting from each of the corners of the edge surface 304 respectively as an electrical lead for the flag, and the power ground connection for the semiconductor die may include all four of the tie bars.

The electrical leads 108 and the tie bar 204, which is exposed as an electrical lead, may extend out from an intermediate level of the edge surface 304 and down to the level of the bottom face 302. The semiconductor device 100 illustrated is a QFP device in which the exposed electrical leads 108 are of gull-wing shape. It will be appreciated that this example of an embodiment of the invention is also applicable to other types of semiconductor device such as small outline integrated circuits (SOICs), thin small outline packages (TSOP), plastic leaded chip package (PLCC) devices, and small outline J-lead (SOJ) devices.

Figure 7:
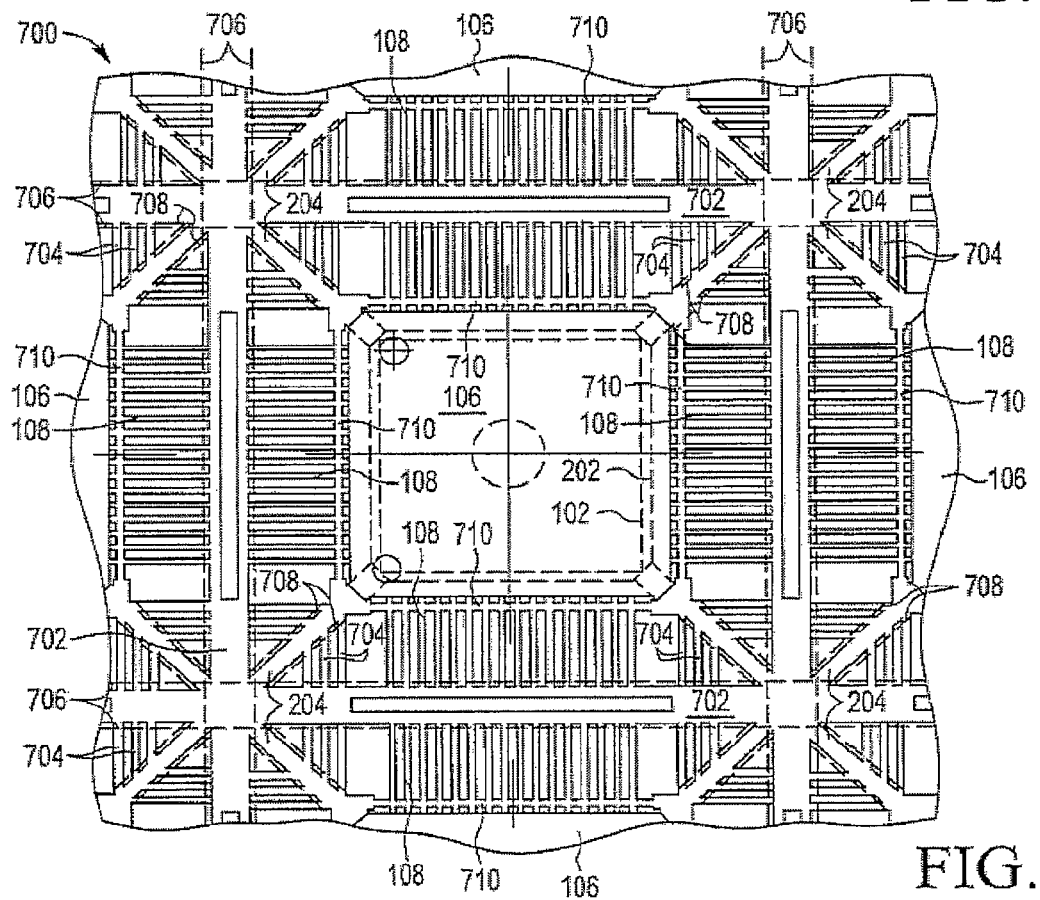
FIG. 7 is a plan view of part of a lead frame structure with encapsulated semiconductor devices used in making the semiconductor device of FIG. 2.
Figure 8:
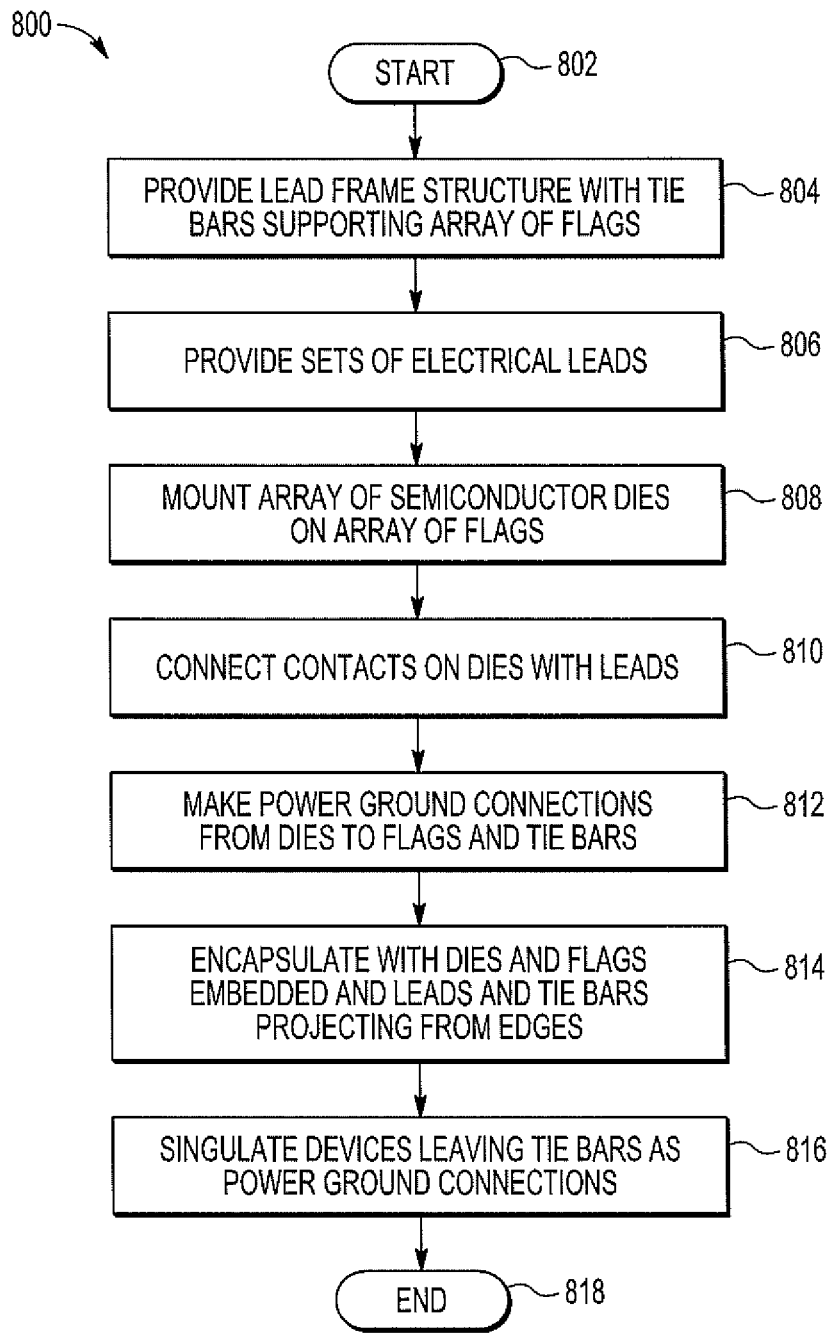
FIG. 8 is a flow chart of a method in accordance with an embodiment of the invention of making a quad flat package semiconductor device such as the semiconductor device of FIGS. 2 to 6.

FIG. 8 illustrates steps in a method 800 in accordance with an embodiment of the invention, given by way of example, of making a surface mount semiconductor devices, such as the semiconductor devices 200 of FIGS. 2 to 6. The method 800 comprises providing a frame structure 700 (shown in FIG. 7) including frame members 702, an array of electrically and thermally conductive flags 202 having corners, and tie bars 204 extending from the corners supporting the flags 202 from the frame members 702. Sets of electrical leads 108 are provided. An array of semiconductor dies 102 each having an active face with internal electrical contacts, and a back face opposite the active face are mounted with the back faces of the semiconductor dies on the array of flags 202. The internal electrical contacts are connected electrically with the electrical leads 108. Power ground connections are provided for the semiconductor dies 102 through the tie bars 204. Encapsulations 106 having top and bottom faces 300 and 302 and edge surfaces 304 are formed, the semiconductor dies 102 and the flags 202 being embedded within the encapsulations 106, and the electrical leads 108 and at the tie bars 204 of the power ground connections projecting from the edge surfaces 304 and being exposed for connection to external electrical circuits 400. Singulating the semiconductor devices 200, includes removing the frame members 702.

Providing the frame structure 700 may include providing the external electrical leads 108 supported by the frame members 702. Connecting the internal electrical contacts electrically with the electrical leads 108 may include electrically connecting sets of bond wires 306 between the internal electrical contacts and the electrical leads 108.

Bond wires 206 may be connected at least mechanically between the semiconductor dies 102 and the tie bars 204 of the power ground connections. The tie bars 204 of the power ground connections and the bond wires 206 connected thereto may extend diagonally out from the flags 202 and from the semiconductor dies 102, and forming the encapsulations 106 may include injecting molding compound into a mold from positions in central parts of the top and/or bottom faces 300, 302. In one example, the edge surfaces 304 of the encapsulations 106 are generally rectangular and each present four corners with four of the tie bars 204 projecting from the corners of the edge surfaces 304 as power ground leads for the semiconductor dies 102, and bond wires 206 are connected at least mechanically between the semiconductor dies 102 and each of the four tie bars 204. Injection of the molding compound produces less wire sweep of the bond wires 206 because the flow of the molding compound from its central injection position is along the bond wires in the corners, rather than being across the bond wires.

In another example, the tie bars 204 of the power connections and the bond wires 206 connected thereto extend diagonally out from the flags 202 and from the semiconductor dies 102, the edge surfaces of the encapsulations 106 are generally rectangular and each presents a first corner and three further corners, with the tie bars 204 projecting from each of the three further corners of the edge surfaces 304 as power ground leads for the flags 202, bond wires 206 are connected at least mechanically between the semiconductor dies 102 and the three tie bars 204 respectively, and forming the encapsulations 106 includes injecting molding compound into a mold from positions adjacent the first corners in the top and/or bottom faces 300, 302. Again, wire sweep of the bond wires 206 is limited because the flow of the molding compound from its injection position in the first corner is remote from the bond wires in the further corners, and not directly across the bond wires.

The power ground connections may include bond wires 208 connecting the semiconductor dies 102 with the flags 104, the flags 104 connecting with at least one of the tie bars 204 of the power ground connections. The tie bars 204 of the power ground connections and the bond wires 206 connected thereto may extend diagonally out from the flag 104 and from the semiconductor die 102. Wire sweep of the bond wires 208 is less than the bond wires connecting to the leads 108, since they are shorter, only extending as far as the sides of the flags 104. In another example of an embodiment of the invention, the bond wires 206 connecting to the tie bars 204 are omitted and, in use, all the power ground current passes through the bond wires 208, the flag 104 and the tie bars 204.

However, it has been found that flow of the molding compound at the corners of the die 102, the flag 104 and the mold during encapsulation is less irregular, and less likely to jerk the bond wires 306 when the corner bond wires 206 are present. In yet another example of an embodiment of the invention, the bond wires 206 connect at least mechanically to the tie bars 204 in addition to the bond wires 208 connecting the semiconductor dies 102 electrically with the flags 104. It is not always convenient to make internal power ground connections within the semiconductor die 102 to bond pads located at the corners of the die. In a variant of this example of an embodiment of the invention, the bond wires 206 are bonded to dummy bond pads, which do not carry power ground current, at the corners of the dies 102 and to the tie bars 204, but reduce the impact of the force from mold compound flow at the corners on the bond wires 306.

The method 800 may include shaping the electrical leads 108 and the tie bars 204 which are exposed for connection to the external electrical circuits 400 to extend out from an intermediate level of the edge surfaces 304 and down to the level of the bottom faces 302.

Figure 2:
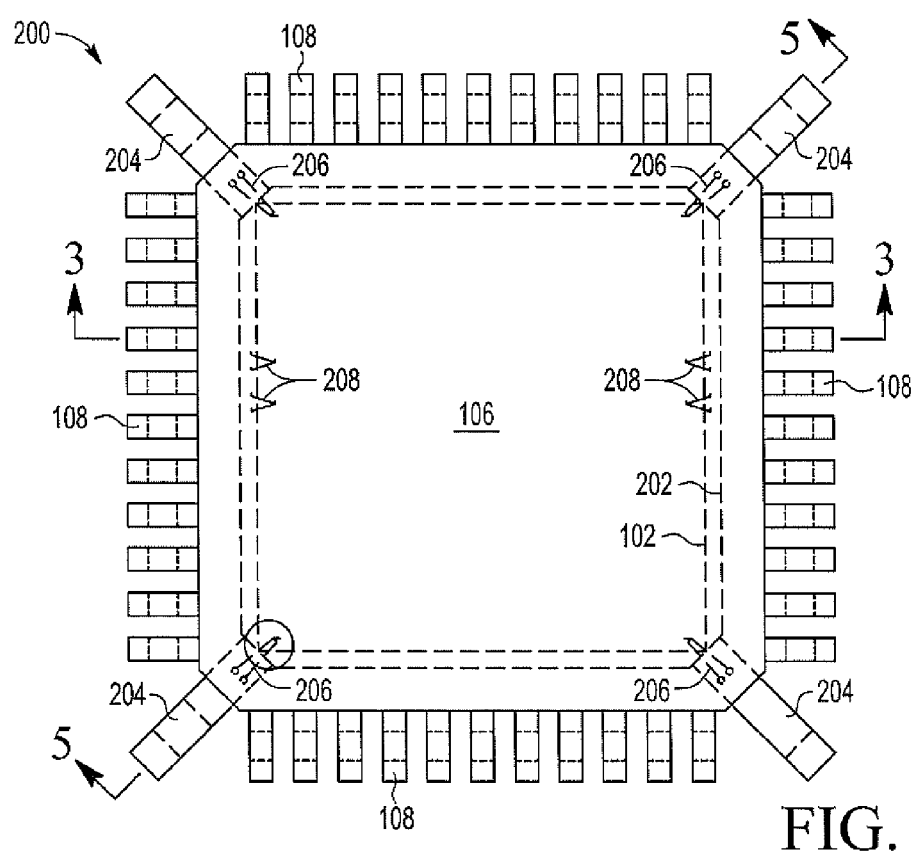
FIG. 2 is a schematic plan view of a quad flat package semiconductor device in accordance with an embodiment of the invention, given by way of example.
Figure 3:
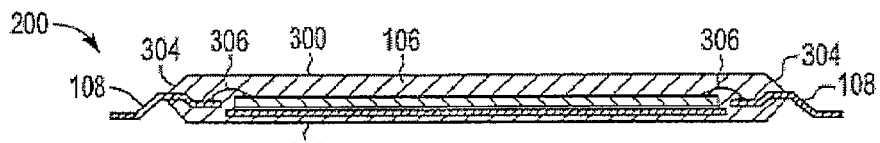
FIG. 3 is a schematic section of the semiconductor device of FIG. 2 along the line 3-3.
Figure 4:
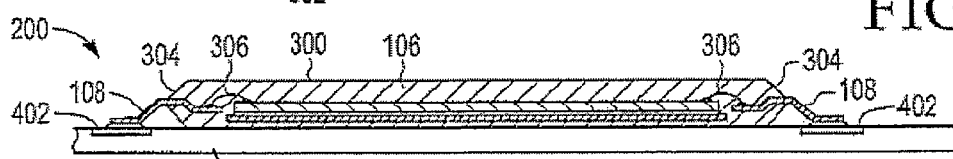
FIG. 4 is a schematic section similar to FIG. 3 along the line 3-3 of the semiconductor device of FIG. 2 mounted on a printed circuit board.
Figure 5:
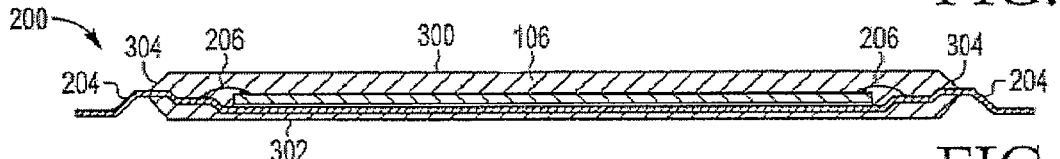
FIG. 5 is a schematic section of the semiconductor device of FIG. 2 along the line 5-5.
Figure 6:
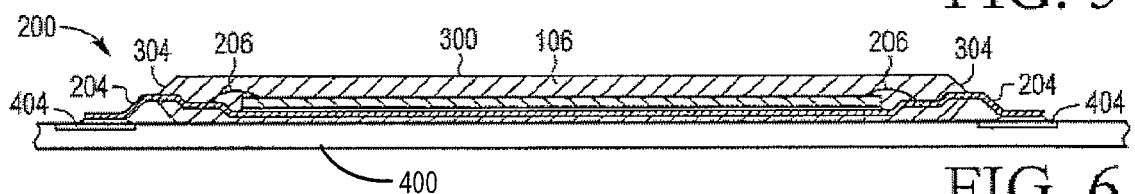
FIG. 6 is a schematic section similar to FIG. 5 along the line 5-5 of FIG. 2 of the semiconductor device of FIG. 2 mounted on a printed circuit board.

In more detail, as shown in FIGS. 4 and 6, the completed device, as shown in FIGS. 2, 3 and 5 may be mounted in use on the external PCB 400. The leads 108 are soldered to contacts 402 on the PCB 400 and the tie bars 204 are soldered to contacts 404 on the PCB 400 as power ground leads.

FIG. 7 illustrates a stage in the production of an array of the semiconductor devices 200 after encapsulation, but before trim and form operations result in singulation. The tie bars 204 extend between the corners of the flags 202 and the adjacent corners between two frame members 702 of the lead frame structure 700 and support the array of flags and of semiconductor dies during manufacturing manipulations until and including encapsulation. The tie bars 204 are shaped as elongate leads of greater width than the leads 108, to reduce their electrical resistance. The support that the tie bars 204 provide is reinforced by lateral supports, in this example in the shape of fingers such as 704, which supplement the mechanical connection of the tie bars to the frame members 702. During singulation, the frame members 702 of the lead frame structure 700 are cut off along singulation streets 706 (shown in chain-dotted lines), for example by sawing, punching or selectively etching, and are discarded. The tie bars 204 are not cut off, as they are in the conventional semiconductor devices 100, but the reinforcement fingers 704 are cut off as indicated at 708 (in chain-dotted lines) and discarded. Dam bars (or rails) 710 connect the leads 108 to reinforce the frame structure and reduce movement of the inner ends of the leads 108 before and during encapsulation. The dam bars 710 are trimmed off in the same operations as the frame members 702 and the lateral fingers 704. After singulation, while the semiconductor devices 200 are still positioned in array, the leads 108 and the tie bars 204 are formed into gull-wing shape by a press tool.

FIG. 8 illustrates a summary of the method 800. The method starts at 802. At 804, the frame structure 700 is provided, including the frame members 702 supporting the array of electrically and thermally conductive flags 202. The sets of electrical leads 108 are provided at 806, integral with, and supported by the frame members 702 in the example illustrated of the frame structure 700. At 808, the array of semiconductor dies 102 is mounted on the array of flags 202. The internal contacts on the active faces of the dies 102 are connected by the bond wires 306 to the leads 108 at 810. At 812, power ground connections are made from the semiconductor dies 102 to the tie bars 204 by bond wires 206.

At 814, the individual semiconductor devices 200 are encapsulated, with the semiconductor dies 102, the flags 202 and the bond wires 206 and 306 embedded within the encapsulations 106, and with the electrical leads 108 and the tie bars 204 projecting from the edge surfaces 304 and exposed for connection to external electrical circuits 400. Singulating the semiconductor devices 200 is performed at 816, including removing the frame members 702 and the fingers 704 but leaving the tie bars 204 as power ground connections. The method ends at 818, with the resulting semiconductor devices 200 ready for use.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor die described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals or power from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A surface mount semiconductor device, comprising:
    an electrically and thermally conductive flag having corners and tie bars extending from said corners;
    a semiconductor die having an active face with internal electrical contacts, and a back face opposite said active face mounted on said flag;
    an encapsulation having top and bottom faces and an edge surface, wherein said semiconductor die and said flag are embedded within said encapsulation;
    a set of exposed electrical leads connected with said internal electrical contacts, said exposed electrical leads being supported by said encapsulation and projecting from said edge surface for connection to an external electrical circuit;
    wherein said semiconductor die has a power ground connection through at least one of said tie bars that is exposed as a power ground lead for said semiconductor die and projects from said edge surface for connection to said external electrical circuit, and
    at least one first bond wire connecting at least one dummy bond pad at a corner of said semiconductor die to said at least one of said tie bars, wherein said at least one dummy bond pad does not carry power ground current.

2. The semiconductor device of claim 1, further comprising second bond wires that connect said internal electrical contacts and said exposed electrical leads.

3. The semiconductor device of claim 1, wherein said at least one of said tie bars of said power ground connection and said at least one first bond wire connected thereto extend diagonally out from said flag and from said semiconductor die.

4. The semiconductor device of claim 1, wherein said power ground connection includes at least one third bond wire connecting said semiconductor die with said flag, wherein said flag connects to said at least one of said tie bars that is exposed as a power ground lead.

5. The semiconductor device of claim 4, wherein said at least one of said tie bars of said power ground connection and said at least one first bond wire connected thereto extend diagonally out from said flag and from said semiconductor die.

6. The semiconductor device of claim 1, wherein said edge surface of said encapsulation is rectangular and has four corners, and said at least one of said tie bars that is exposed as a power ground lead projects from a corner of said edge surface of said encapsulation.

7. The semiconductor device of claim 1, wherein said edge surface of said encapsulation is rectangular and has four corners with four of said tie bars projecting from each of said corners of said edge surface respectively as an electrical lead for said flag, and said power ground connection for said semiconductor die includes all said four tie bars.

8. The semiconductor device of claim 1, wherein said exposed electrical leads and said at least one of said tie bars that is exposed as a power ground lead extend out from an intermediate level of said edge surface and down to the level of said bottom face.

* * * * *